(12) United States Patent
Ueyama et al.

(10) Patent No.: US 10,775,470 B2
(45) Date of Patent: Sep. 15, 2020

(54) MAGNETIC DETECTION APPARATUS

(71) Applicant: GLORY LTD., Himeji-shi, Hyogo (JP)

(72) Inventors: Naoki Ueyama, Hyogo (JP); Masaaki Hayashi, Hyogo (JP)

(73) Assignee: GLORY LTD., Hyogo (JP)

( * ) Notice: Subject to any disclaimer, the term of this patent is extended or adjusted under 35 U.S.C. 154(b) by 106 days.

(21) Appl. No.: 15/774,744

(22) PCT Filed: Nov. 11, 2016

(86) PCT No.: PCT/JP2016/083481
§ 371 (c)(1),
(2) Date: May 9, 2018

(87) PCT Pub. No.: WO2017/082379
PCT Pub. Date: May 18, 2017

(65) Prior Publication Data
US 2018/0329012 A1    Nov. 15, 2018

(30) Foreign Application Priority Data
Nov. 13, 2015 (JP) .................................. 2015-223245

(51) Int. Cl.
*G01R 33/02* (2006.01)
*G01R 35/00* (2006.01)
(Continued)

(52) U.S. Cl.
CPC ........... *G01R 35/005* (2013.01); *G01R 33/02* (2013.01); *G01R 33/09* (2013.01); *G01R 35/00* (2013.01);
(Continued)

(58) Field of Classification Search
CPC .......... G07D 7/04; G01R 33/02; G01R 33/09; G01R 35/00
See application file for complete search history.

(56) References Cited

U.S. PATENT DOCUMENTS

2014/0116840 A1* 5/2014 Maekawa ............. G07D 7/164
194/320
2015/0260805 A1* 9/2015 Miura ................ G01R 33/1253
324/228
(Continued)

FOREIGN PATENT DOCUMENTS

JP   8-255276 A   10/1996
JP   2004-108955 A   4/2004
(Continued)

OTHER PUBLICATIONS

Japanese Office Action (Application No. 2015-223245) (4 pages, dated Jan. 7, 2017).

*Primary Examiner* — Alesa Allgood
(74) *Attorney, Agent, or Firm* — Renner, Kenner, Greive, Bobak, Taylor & Weber

(57) ABSTRACT

One object is to correct with a high accuracy a plurality of magnetic sensors arranged inside a small magnetic detection apparatus. The magnetic detection apparatus that detects magnetism of a paper sheet being transported includes a plurality of magnetic sensors arranged in a linear manner in a direction orthogonal to a transport direction of the paper sheet; an excitation member having a plate-shape that extends in an arrangement direction of the plurality of magnetic sensors; and a control unit that generates a calibration magnetic field by passing an electric current in the arrangement direction through the excitation member, and obtains a correction value for correcting variation in sensitivity of the plurality of magnetic sensors based on detection results of the calibration magnetic field detected by the plurality of magnetic sensors.

12 Claims, 7 Drawing Sheets

(51) Int. Cl.
*G01R 33/09* (2006.01)
*G07D 7/04* (2016.01)
*G01V 3/08* (2006.01)
*G07D 7/20* (2016.01)

(52) U.S. Cl.
CPC ................ *G01V 3/08* (2013.01); *G01V 3/081* (2013.01); *G07D 7/04* (2013.01); *G07D 7/2075* (2013.01)

(56) References Cited

U.S. PATENT DOCUMENTS

2015/0369882 A1* 12/2015 Mochizuki ............ H01F 7/0278
 324/252
2016/0071350 A1* 3/2016 Ueyama .................. G07D 7/04
 324/228
2016/0275744 A1* 9/2016 Ueyama ................ G01R 33/12

FOREIGN PATENT DOCUMENTS

JP 4207711 B2 10/2008
WO 2014/156793 A1 10/2014

* cited by examiner

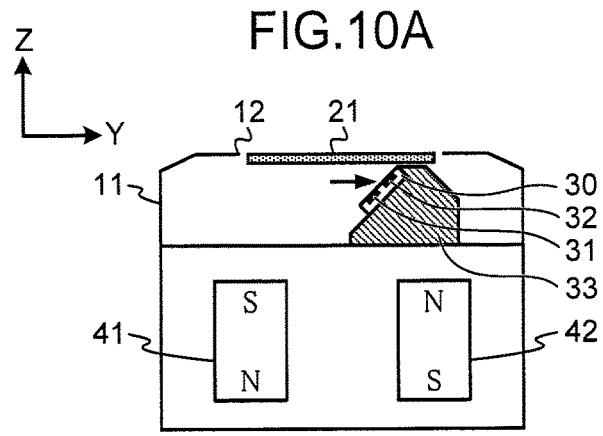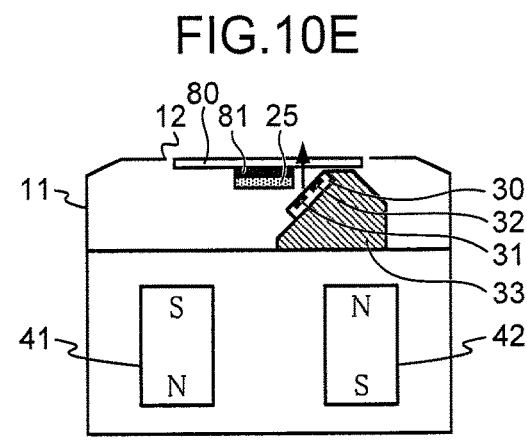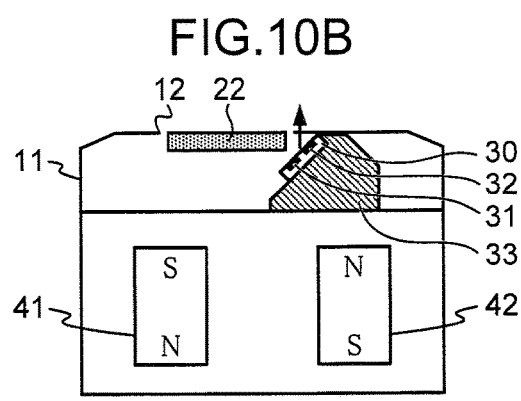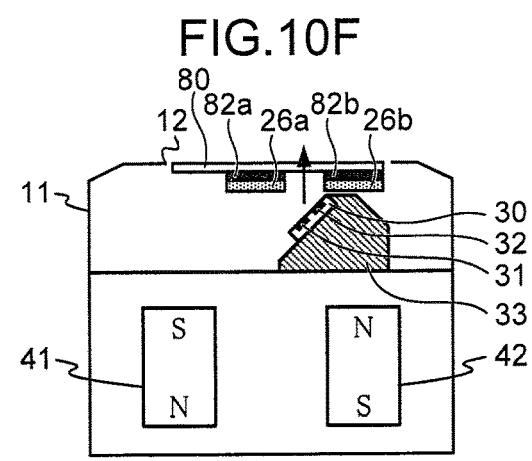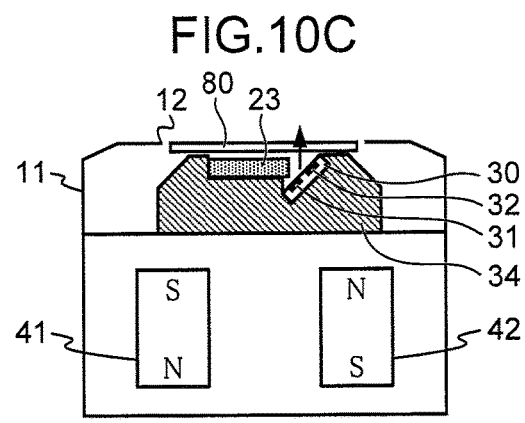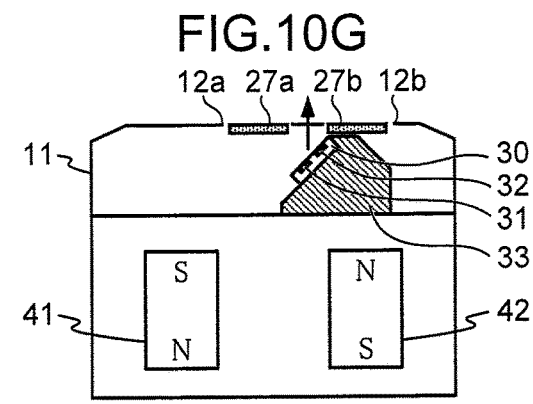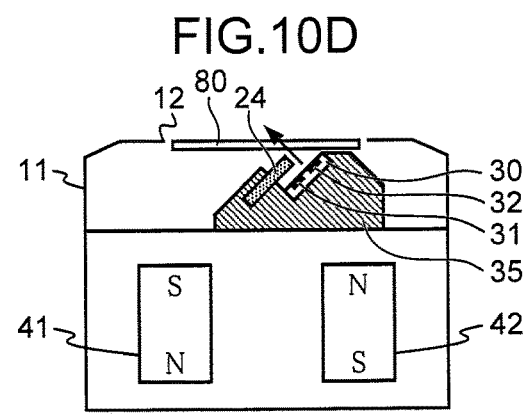

MAGNETIC DETECTION APPARATUS

TECHNICAL FIELD

The present invention relates to a magnetic detection apparatus capable of detecting magnetism of a paper sheet.

BACKGROUND ART

A magnetic detection apparatus capable of detecting magnetism of a paper sheet being transported is known conventionally. For example, a magnetic detection apparatus is arranged inside a banknote handling apparatus that performs recognition and counting of banknotes. Magnetic characteristics of each of the banknotes are detected by using the magnetic detection apparatus, and authenticity and the like of each of the banknotes is recognized based on the obtained detection result. For example, a plurality of magnetic sensors is arranged in a linear manner inside the magnetic detection apparatus, and the magnetism of the banknotes is detected after performing calibration of those magnetic sensors.

For example, Patent Document 1 discloses an apparatus in which a linear conducting wire is arranged corresponding to the plurality of sensors arranged in a liner manner, and the calibration of each of the magnetic sensors is performed by generating a calibration magnetic field by passing an electric current in this conducting wire. Patent Document 2 discloses an apparatus that generates a calibration magnetic field with a rectangular plate-shaped conductor and performs the calibration of the magnetic sensors.

CITATION LIST

[Patent Document]
[Patent Document 1] Japanese Patent No. 4207711
[Patent Document 2] Japanese Patent Application Laid-Open No. 2015-175647

SUMMARY OF INVENTION

Technical Problem

However, in the conventional technology, when there is a magnetic sensor that is out of position from the line of the plurality of magnetic sensors arranged in the linear manner, different calibration magnetic fields are detected in this magnetic sensor than in the other magnetic sensors, and the calibration may not be performed with a high accuracy. Moreover, when a high-performance and small magnetic detection apparatus is required, if it is necessary to secure a space for arranging inside a sensor case a member for generating the calibration magnetic field, this hinders any efforts to downsize the apparatus. Moreover, if a distance between magnetic sensors and a paper sheet targeted for the magnetic detection is long for securing the space therebetween, the accuracy of the magnetic detection decreases.

The present invention is made to address the problems in the conventional technology. One object of the present invention is to provide a small magnetic detection apparatus capable of performing calibration of a plurality of magnetic sensors with a high accuracy.

Means for Solving Problems

To solve the above problems and to achieve the above object, according to one aspect of the present invention, a magnetic detection apparatus that detects magnetism of a paper sheet being transported includes a plurality of magnetic sensors arranged in a linear manner in a direction that is orthogonal to a transport direction of the paper sheet; an excitation member having a plate-shape that extends in an arrangement direction of the magnetic sensors; and a control unit that generates a calibration magnetic field by passing an electric current in the arrangement direction through the excitation member, and obtains a correction value for correcting variation in sensitivity of the plurality of magnetic sensors based on detection results of the calibration magnetic field detected by the magnetic sensors.

In the above magnetic detection apparatus, a part of at least one surface of the excitation member is exposed to an outside of the magnetic detection apparatus, and an exposed part acts as a cover of the magnetic detection apparatus and is used as a magnetic detection surface.

In the above magnetic detection apparatus, the excitation member is connected to ground, and the electric current is passed through the excitation member only when the calibration magnetic field is to be generated.

In the above magnetic detection apparatus, the calibration magnetic field is generated below a lower surface of the excitation member such that a direction of the magnetic field is substantially parallel to the lower surface of the excitation member but orthogonal to the arrangement direction of the plurality of magnetic sensors.

In the above magnetic detection apparatus, the calibration magnetic field is generated on a side surface side of the excitation member such that a direction of the magnetic field is substantially parallel to the side surface of the excitation member but orthogonal to the arrangement direction of the plurality of magnetic sensors.

In the above magnetic detection apparatus, the control unit is configured to, at the time of manufacturing, generate the calibration magnetic field by using the excitation member, obtain an initial correction value for correcting variation in the sensitivity of the plurality of magnetic sensors, and store the obtained initial correction value. Moreover, the control unit is configured to, when starting magnetic detection of the paper sheet, generate the calibration magnetic field by using the excitation member, correct by using the initial correction value a detection value of the calibration magnetic field detected by the magnetic sensor, and obtain, based on the corrected detection value, a measuring-error correction value for correcting variation in the sensitivity of the plurality of magnetic sensors. Furthermore, the control unit is configured to, during the magnetic detection of the paper sheet, correct a detection value of the magnetism of the paper sheet by using the measuring-error correction value.

In the above magnetic detection apparatus, after generation of the calibration magnetic field by using the excitation member is repeated for a predetermined number of times, the calibration magnetic field is generated again by using the excitation member to obtain a correction value.

In the above magnetic detection apparatus, each of the plurality of magnetic sensor includes two magnetic sensing elements.

In the above magnetic detection apparatus, the magnetic sensor is supported in an inclined manner inside the magnetic detection apparatus such that a distance from a transport surface on which the paper sheet is transported to one magnetic sensing element is different from a distance from the transport surface to the other magnetic sensing element.

Advantageous Effects of Invention

According to the present invention, in the magnetic detection apparatus in which the plurality of magnetic sensors are arranged in a linear manner, the calibration magnetic field can be generated by using the excitation member that is made of a rectangular plate-shaped member that is long in the arrangement direction of the magnetic sensors and the correction value for correcting the variation in the sensitivity of the magnetic sensors can be obtained. Moreover, because the excitation member also serves as the cover that covers the magnetic sensors, the magnetic detection apparatus can be downsized as compared to a situation in which the excitation member is arranged between the cover and the magnetic sensors. Accordingly, the magnetic sensors can be arranged closer to the paper sheet, and it is advantageous to improve resolution of each of the magnetic sensors.

BRIEF DESCRIPTION OF DRAWINGS

FIGS. 10A, 10B, 10C, 10D, 10E, 10F and 10G are views indicating different examples of the excitation member that generates the calibration magnetic field.

DESCRIPTION OF EMBODIMENTS

Exemplary embodiments of a magnetic detection apparatus according to the present invention are explained in detail with reference to the accompanying drawings. The magnetic detection apparatus has a function to detect magnetism of the paper sheet. In the following explanation, an example in which a magnetic detection apparatus is arranged inside a banknote handling apparatus, and the magnetic detection apparatus is used for detecting magnetic characteristics of a banknote being transported inside the apparatus and recognizing authenticity and the like of the banknote is explained.

Figure 1:
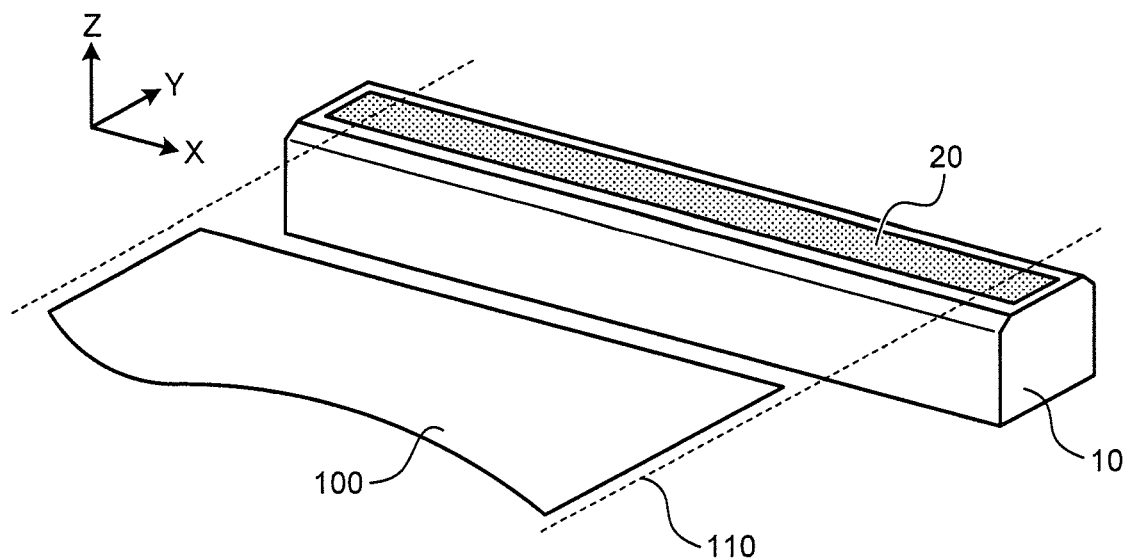
FIG. 1 is a schematic diagram indicating an external appearance of a magnetic detection apparatus according to the present embodiment.

FIG. 1 is a schematic diagram indicating an external appearance of a magnetic detection apparatus 10 according to the present embodiment. The magnetic detection apparatus 10 is arranged in a transport path 110 on which a banknote 100 is transported in a banknote handling apparatus. The magnetic detection apparatus 10 is arranged such that an apparatus upper surface including a sensor cover (excitation member) 20 falls in the same plane as a transport surface of the transport path 110. Transport of the banknote 100 is guided such that the banknote 100 is transported between two dotted lines shown in FIG. 1 on the transport path 110. The banknote 100 is transported by using a plurality of rollers, belts, and the like toward a positive Y-axis direction. Though not shown in FIG. 1, a brush roller is arranged above the upper surface of the magnetic detection apparatus 10, and the banknote 100 that is transported on the transport path 110 is pressed against the sensor cover 20 by the brush roller. Note that, in FIG. 1, an example in which the magnetic detection apparatus 10 is arranged below the transport path 110 has been shown; however, the magnetic detection apparatus 10 can be arranged above the transport path 110.

Figure 2:
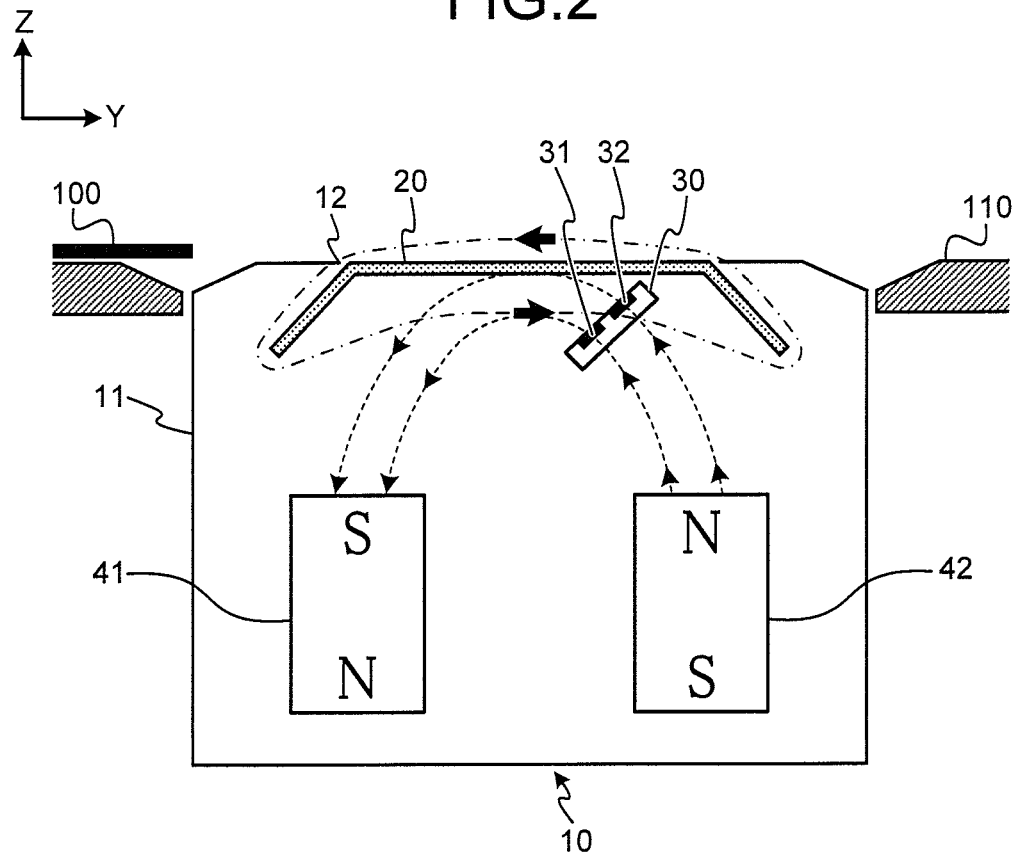
FIG. 2 is a schematic cross section indicating an internal structure of the magnetic detection apparatus when seen from a side thereof.
Figure 3:
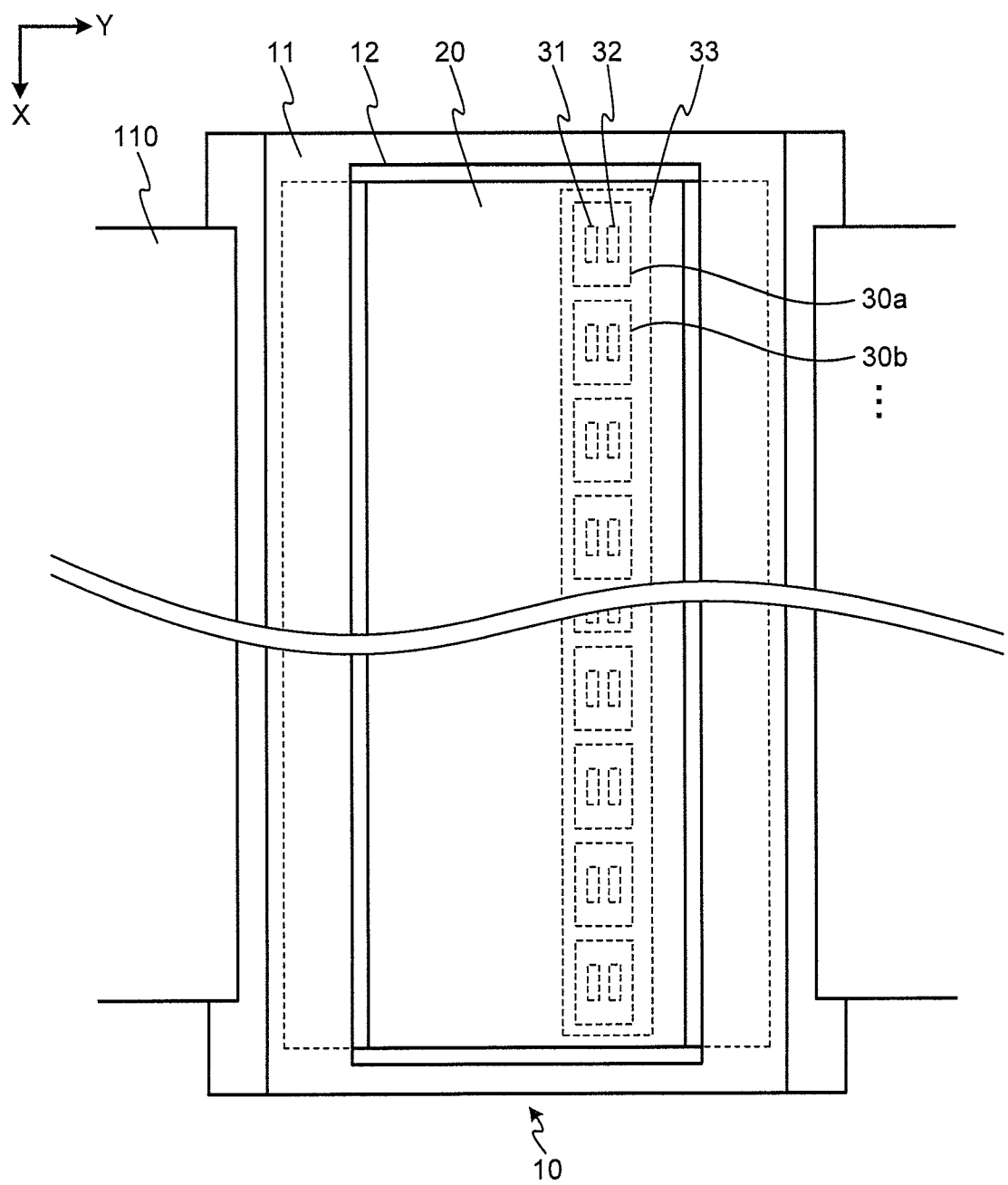
FIG. 3 is a schematic diagram indicating the magnetic detection apparatus when seen from above.

FIG. 2 is a schematic cross section indicating an internal structure of the magnetic detection apparatus 10 when seen from a side thereof. FIG. 3 is a schematic diagram indicating the magnetic detection apparatus 10 when seen from above. As shown in FIG. 2, two bias magnets 41 and 42 and a magnetic sensor 30 are arranged in a resin case 11 made of nonmagnetic material. The two bias magnets 41 and 42 generate a bias magnetic field, and the magnetic sensor 30 detects a change of the bias magnetic field when the banknote 100 passes through the bias magnetic field. The magnetic sensor 30 includes two magnetic sensing elements 31 and 32. The magnetic sensor 30 is supported in an inclined manner inside the case 11. The magnetic sensor 30 is arranged in the inclined manner such that a distance in a Z-axis direction from the transport surface of the transport path 110 to the magnetic sensing element 31 is longer than a distance in the Z-axis direction from the transport surface to the magnetic sensing element 32. Note that, in FIG. 2, to explain each of the sensor cover 20 and the magnetic sensor 30, the bias magnetic field (dotted lines in FIG. 2) generated around the bias magnets 41 and 42 and a calibration magnetic field (alternate long and short dash line in FIG. 2) generated around the sensor cover 20 are shown separately for convenience sake.

The magnetic sensor 30 of one channel is formed by the two magnetic sensing elements 31 and 32. As shown in FIG. 3, the magnetic sensors 30 (30a, 30b, . . . ) of several channels (e.g., 200 channels) are arranged on one substrate in a linear manner and supported by a sensor support member 33. The magnetic sensors 30 are arranged in the linear manner along a direction (X-axis direction) that is orthogonal to a transport direction (the Y-axis direction) of the banknote 100. The magnetic sensors 30 can detect magnetism of an entire surface in a width direction, which is the X-axis direction, of the banknote 100 that is transported on the transport path 110. The banknote 100 transported on the transport path 110 passes over the upper surface of the magnetic detection apparatus 10 including the sensor cover 20, and the magnetism of the entire surface of the banknote 100 can be detected by using the magnetic sensors 30.

As shown in FIG. 2, the bias magnetic field, which is shown with the dotted lines from the right bias magnet 42 to the left bias magnet 41, is generated between the two bias magnets 41 and 42 that are arranged with a distance therebetween along the Y-axis direction. The magnetic sensor 30 is arranged such that a change amount of the bias magnetic field can be detected when a magnetic material passes on the transport path 110. For example, the magnetic sensor 30 includes the two magnetic sensing elements 31 and 32 that are constituted by magnetoresistive elements. The magnetic sensor 30 outputs a change in a resistance of the two magnetoresistive elements as a change in a voltage. The magnetic detection apparatus 10 detects a magnetic charge of the magnetic material included in the banknote 100 by using the output voltage as a detection signal of the magnetic material. Because such a magnetic sensor capable of detecting the magnetic charge is known conventionally, the detailed explanation thereof will be omitted. The magnetic sensor 30 is arranged in the inclined manner such that the magnetic sensor 30 makes an angle with respect to the transport surface (XY plane) on which the banknote 100 is transported. The magnetic sensor 30 has a function to output a detection signal depending on the magnetic charge of the magnetic material. Because such a magnetic sensor 30 has been explained in PCT Publication No. WO2014/168180, the detailed explanation thereof will be omitted.

The sensor cover 20 made of conductive nonmagnetic material is arranged covering the magnetic sensor 30 on an upper surface of the case 11. As shown in FIG. 2, the sensor cover 20 is made of a rectangular plate-shaped thin member that is long in the X-axis direction and both outer sides thereof are bent downward. The sensor cover 20 includes a flat part that is parallel to the XY plane and two inclined parts on the both outer sides of the flat part. The magnetic sensor 30 is arranged between the inclined parts on the both sides of the sensor cover 20. The magnetic sensor 30 is arranged below the flat part of the sensor cover 20. As shown in FIG. 3, the sensor cover 20 is arranged such that a part of the upper surface thereof is exposed to the outside from an opening 12 of the case 11. The upper surface of the sensor cover 20 exposed from the opening 12 falls in the same plane as the transport surface of the transport path 110 on which the banknote 100 is transported. The magnetic sensor 30 detects magnetism of the banknote 100 passing on the upper surface of the sensor cover 20. The upper surface of the sensor cover 20 exposed to the outside of the case 11 is used as a magnetic detection surface.

The banknote 100 is pressed down against the sensor cover 20 by the not-shown brush roller arranged above the flat part of the sensor cover 20 so that the banknote 100 slides and passes over an upper surface of the flat part. The sensor cover 20 is made of material having wear resistance. The sensor cover 20 is made of nonmagnetic conducting material. For example, the sensor cover 20 is made of metal such as stainless steel, brass, and titanium, or conductive ceramics.

One of the features of the magnetic detection apparatus 10 is that the sensor cover 20 is used as the excitation member that generates the calibration magnetic field for calibrating the magnetic sensor 30. By passing an electric pulse current of a predetermined current value through the sensor cover 20 from the end thereof in the X-axis direction to the other end thereof, the calibration magnetic field is generated around the sensor cover 20 as shown with the alternate long and short dash line in FIG. 2. The direction of the calibration magnetic field will be in the Y-axis direction near the magnetic sensor 30. The direction and a magnetic field intensity of the calibration magnetic field are substantially the same near the position at which the magnetic sensors 30 are arranged below a lower surface of the flat part of the sensor cover 20. Therefore, even when there is a magnetic sensor 30 that is out of position among the magnetic sensors 30 arranged in the linear manner parallel to the X-axis, or there is a shift in the positional relationship in the arrangement position of the sensor cover 20 and the magnetic sensor 30, each of all the magnetic sensors 30 can detect the calibration magnetic field having substantially the same direction and substantially the same magnetic field intensity. As a result, all the magnetic sensors 30 arranged in the linear manner can be calibrated with a high accuracy.

Figure 4:
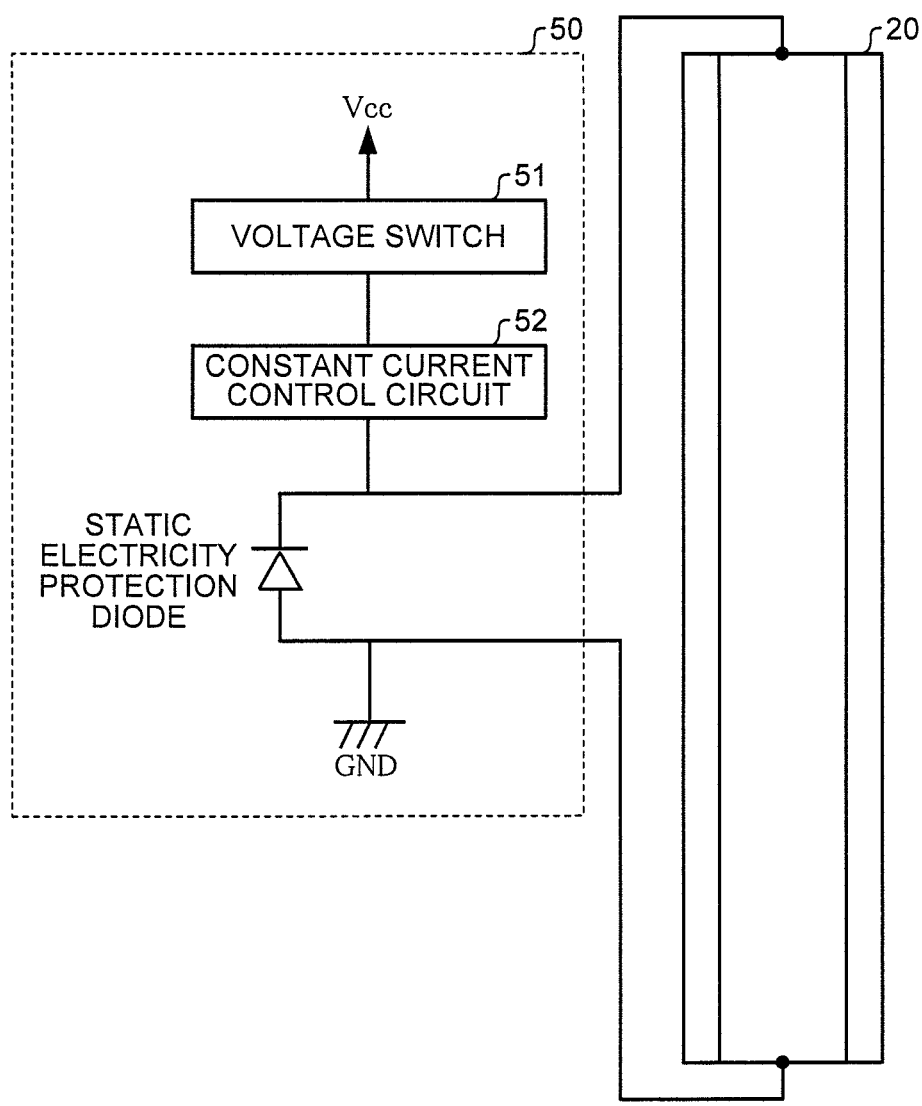
FIG. 4 is a view indicating a calibration circuit that generates a calibration magnetic field with a sensor cover.

FIG. 4 is a view indicating a calibration circuit 50 that generates the calibration magnetic field with the sensor cover 20. A voltage switch 51 is an ON/OFF switching circuit constituted by a transistor such as MOSFET. The voltage switch 51 has a function to pass a pulse current in the sensor cover 20 by performing on-off control on the applied voltage. A constant current control circuit 52 is a circuit that uses an operational amplifier and the like. When the electric voltage is applied by the voltage switch 51, the constant current control circuit 52 controls the pulse current such that the current value of the pulse current passing through the sensor cover 20 is constant. A diode is arranged between the constant current control circuit 52 and ground for taking measures against static electricity.

In the magnetic detection apparatus 10, the sensor cover 20 is connected to ground. An electric potential of the sensor cover 20 is the ground potential except when the electric current is passed in the sensor cover 20 to generate the calibration magnetic field and therefore, adverse effect of external noise, such as static electricity and/or electric field noise, on the magnetic sensor 30 is prevented.

Figure 5:
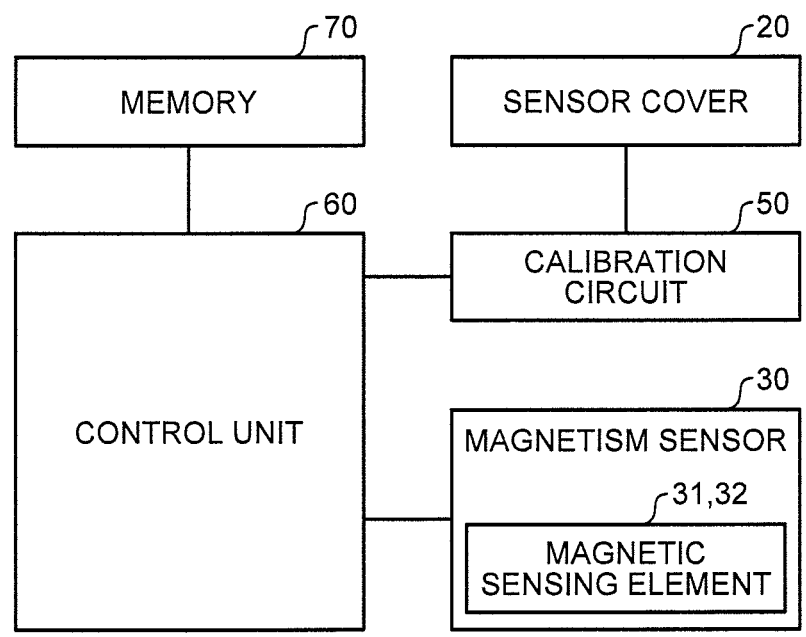
FIG. 5 is a block diagram indicating an outline of a functional configuration of the magnetic detection apparatus.

FIG. 5 is a block diagram indicating a schematic functional configuration of the magnetic detection apparatus 10. The magnetic detection apparatus 10 includes a control unit 60 and a memory 70 in addition to the above-mentioned configuration. When performing the calibration of the magnetic sensor 30, the control unit 60 controls the calibration circuit 50 to generate the calibration magnetic field around the sensor cover 20. The control unit 60 controls a magnetic detection operation performed by the magnetic sensors 30. The control unit 60 acquires a magnetic detection result by the magnetic sensors 30, and determines a correction value for correcting a variation in a sensitivity of each the magnetic sensors 30. The memory 70 is a nonvolatile storage apparatus. The control unit 60 stores data relating to the correction value of the magnetic sensors 30 in the memory 70.

Though not shown in FIG. 5, the control unit 60 of the magnetic detection apparatus 10 is connected to a control unit of the banknote handling apparatus that incorporates the magnetic detection apparatus 10. The control unit 60 of the magnetic detection apparatus 10 can exchange data with the control unit of the banknote handling apparatus. The banknote handling apparatus has a function to detect a position on the transport path 110 of the banknote 100 transported to the magnetic detection apparatus 10 by using a transport path sensor and the like. Such a transport path sensor is constituted by a light outputting and receiving unit provided on the transport path 110. When the magnetic detection apparatus 10 detects the magnetism of the banknote, the control unit 60 acquires information regarding the transport position of the banknote 100 on the transport path 110 from the banknote handling apparatus. Then, the control unit 60 performs a process to detect the magnetism of the banknote 100 when the banknote 100 passes a magnetic sensing region of the magnetic sensor 30.

Note that, it is not necessary that the magnetic detection apparatus 10 includes the control unit 60 and the memory 70. That is, the control unit and a memory of the banknote handling apparatus that incorporates the magnetic detection apparatus 10 can be used as the control unit 60 and the memory 70 shown in FIG. 5.

A calibration method of the magnetic detection apparatus 10 is explained below. The magnetic detection apparatus 10 corrects the variation in the sensitivity by performing two types of calibrations, that is, a manufacturing-error calibration and a measuring-error calibration. The manufacturing-error calibration is performed when the magnetic detection apparatus 10 is manufactured. The manufacturing-error calibration is performed when the magnetic detection apparatus 10 is in a state in which it is not affected by any external noise and the like. The manufacturing-error calibration is a calibration processing to obtain an initial correction value for correcting an error in the magnetic detection result of the calibration magnetic field generated by using the sensor cover 20. Such error can occur due to a manufacturing variation and the like in the arrangement position of the magnetic sensors 30 arranged in the linear manner and/or performance of the magnetic sensors 30. On the other hand, the measuring-error calibration is a processing performed when performing banknote handling by the banknote handling apparatus that incorporates the magnetic detection apparatus 10. The measuring-error calibration is a calibration processing to obtain a measuring-error correction value for correcting the effect of the environment such as temperature, magnetic field, and the like on the magnetic detection apparatus 10.

Figure 6A:
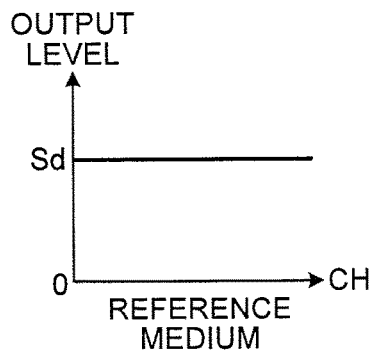
FIGS. 6A, 6B and 6C are views for explaining a manufacturing-error calibration.

FIG. 6 is a view for explaining the manufacturing-error calibration. Note that, a horizontal axis of graphs shown in FIGS. 6A to 8B corresponds to a channel of the magnetic sensor 30 included in the magnetic detection apparatus 10. In a graph that is shown with a solid line, a vertical axis corresponds to an output level of the magnetic sensor 30. In a graph that is shown with a dotted line, a vertical axis corresponds to the correction value of the magnetic sensor 30.

In the manufacturing-error calibration, which is performed when the magnetic detection apparatus 10 is manufactured, a processing to detect magnetism of a reference medium is performed. Specifically, the reference medium for calibration whose magnetic characteristics to be detected by the magnetic sensor 30 are known is transported as shown in FIG. 1, and the control unit 60 acquires a magnetic detection result of the reference medium by the magnetic sensor 30. For example, a medium from which the same magnetic charge is detected by the magnetic sensors 30 of all the channels is used as the reference medium. Before starting the manufacturing-error calibration, a state of the magnetic detection apparatus 10 is maintained such that all the magnetic sensors 30 can correctly detect the magnetism within a certain error range. Therefore, as shown in FIG. 6A, substantially the same output level is obtained from the magnetic sensor 30 of each channel that detected the magnetism of the reference medium.

After that, the control unit 60 controls the calibration circuit 50 to apply a constant pulse current to the sensor cover 20. Accordingly, the calibration magnetic field is generated around the sensor cover 20 as shown with the alternate long and short dash line in FIG. 2. Then, the control unit 60 acquires the magnetic detection result of the calibration magnetic field from each magnetic sensor 30. Note that, it is allowable to apply to the sensor cover 20 a constant pulse current for a predetermined number of times set previously, acquire an output level of each magnetic sensor 30 each time the electric current is applied, and use an average value of the acquired output levels as the magnetic detection result obtained by the magnetic sensor 30.

Figure 6B:
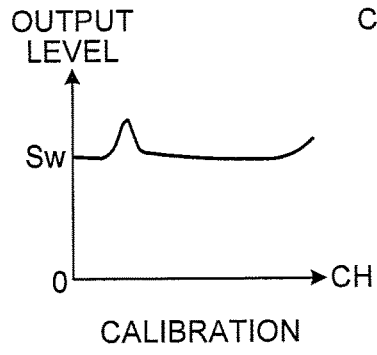

In an ideal situation in which there is no adverse effect of manufacturing variation such as assembling error at the time of manufacturing, a flat output level shown in FIG. 6A is obtained when the calibration magnetic field generated with the sensor cover 20 is detected by the magnetic sensor 30 of each of the channels. However, when there is a magnetic sensor 30 that is out of position among the magnetic sensors 30 arranged in the linear manner parallel to the X-axis, or there is a shift in the positional relationship of the sensor cover 20 and the magnetism sensor 30, for example, an output level Sw is obtained as shows in FIG. 6. As shown in FIG. 6B, output levels of some channels are different from output levels of other channels.

Figure 6C:
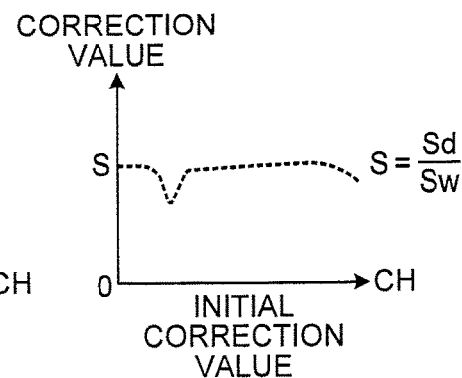

After the output level Sw shown in FIG. 6B is obtained, the control unit 60 obtains a ratio (Sd/Sw) shown in FIG. 6C. FIG. 6C shows ratios between the output level Sd of the magnetic sensor 30 of each channel obtained by detecting the magnetism of the reference medium and the output level Sw of the magnetic sensor 30 of each channel obtained by detecting the magnetism of the calibration magnetic field. The control unit 60 takes this ratio as an initial correction value S. The control unit 60 stores in the memory 70 the output level Sw of each channel that is the magnetic detection result obtained from the reference medium and the initial correction value S of each channel that is obtained when the calibration magnetic field is present.

In this manner, when the output level obtained by detecting the magnetism of the calibration magnetic field by the magnetic sensors 30 includes an error due to the manufacturing variation and the like at the time of manufacturing of the sensor cover 20 and the magnetic sensor 30, the magnetic detection apparatus 10 can obtain the initial correction value S for correcting such error and store the initial correction value S in the memory 70. When the output level Sw shown in FIG. 6B obtained by detecting the calibration magnetic field by each of the magnetic sensors 30 is corrected by using the initial correction value S shown in FIG. 6C, the flat output level shown in FIG. 6A is obtained. That is, by correcting the detection value of the calibration magnetic field in each magnetic sensor 30 based on the initial correction value S, an output level of each magnetic sensor 30 becomes substantially the same as the output level obtained when the magnetism of the reference medium is detected in each magnetic sensor 30.

To eliminate any adverse effect of the environment in which the magnetic detection apparatus 10 is used, such as the temperature and the magnetic field, the measuring-error calibration is performed by the magnetic detection apparatus 10 when measurement by the magnetic detection apparatus 10 is actually performed in a financial institution such as a bank.

Figure 7A:
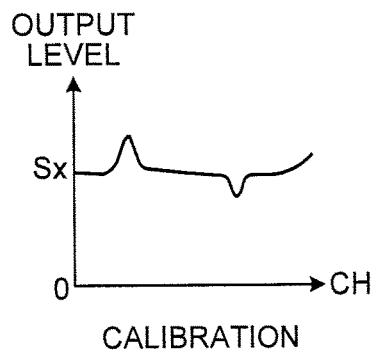
FIGS. 7A and 7B are views for explaining a measuring-error calibration.
Figure 7B:
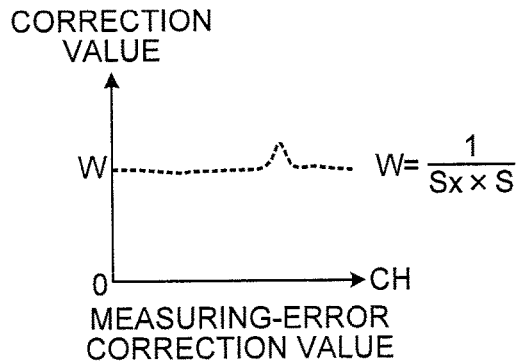

FIGS. 7A and 7B are views for explaining the measuring-error calibration. The measuring-error calibration is started automatically in the banknote handling apparatus that incorporates the magnetic detection apparatus 10. Before the banknote handling apparatus stars the banknote handling by using the magnetic detection apparatus 10, the measuring-error calibration is performed.

The measuring-error calibration is performed, each time the banknote handling is performed. The measuring-error calibration is performed by using the sensor cover 20 without using the reference medium or the banknote. In the measuring-error calibration, at first, the control unit 60 controls the calibration circuit 50 to apply a pulse current to the sensor cover 20 once or several times to generate the calibration magnetic field.

If the magnetic sensing elements 31 and 32 of the magnetic sensor 30 are affected by an outside magnetic field and the like, the output level of the magnetic sensor 30 may become unstable depending on a magnetization state of the magnetic sensing elements 31 and 32. To avoid this, by first generating the calibration magnetic field with the sensor cover 20 to make the magnetization state of the magnetic sensing elements 31 and 32 uniform, the output level obtained by the magnetic sensor 30 can be stabilized. Therefore, the control unit 60 causes the magnetic sensor 30 to start the magnetic detection of the calibration magnetic field after the calibration magnetic field is generated with the sensor cover 20 once or several times. The number of times to generate the calibration magnetic field can be previously fixed to a predetermined number. Alternatively, the output level of the magnetic sensor 30 that detects the magnetism of the calibration magnetic field can be confirmed and the generation of the calibration magnetic field can be repeated until the output level is stabilized.

After completion of the processing to stabilize the output level of the magnetic sensor 30, the control unit 60 starts the processing to obtain a correction value. The control unit 60 controls the calibration circuit 50 to apply the constant pulse current to the sensor cover 20 to generate the calibration magnetic field around the sensor cover 20 as shown with the alternate long and short dash line in FIG. 2. Then, the control unit 60 acquires the magnetic detection result of the calibration magnetic field obtained by the magnetic sensors 30. Even in this case, like in the manufacturing-error calibration, it is allowable to apply to the sensor cover 20 the constant pulse current for a predetermined number of times set previously, acquire an output level of each magnetic sensor 30 each time the electric current is applied, and use an average value of the acquired output levels as the magnetic detection result obtained by each magnetic sensor 30.

After the magnetic detection result of the calibration magnetic field is obtained, the control unit 60 reads the initial correction value S shown in FIG. 6C from the memory 70 and corrects the obtained detection value by using the initial correction value S. As shown in FIG. 7A, an output level Sx obtained by detecting the calibration magnetic field by the magnetic sensor 30 includes the error shown in FIG. 6B due to the manufacturing variation and the like at the time of manufacturing. However this error can be corrected by using the initial correction value S. As a result, as shown in FIG. 7B, the error due to the usage environment can be extracted. The control unit 60 takes thus-obtained value shown in FIG. 7B as a measuring-error correction value W.

Specifically, the error due to the manufacturing variation and the like at the time of manufacturing is corrected by multiplying the output level Sx, which is obtained by detecting the calibration magnetic field, with the initial correction value S. An inverse of the value obtained as a result of this multiplication is taken as the measuring-error correction value W. The control unit 60 stores the obtained measuring-error correction value W in the memory 70.

In an ideal situation in which there is no adverse effect of the usage environment such as the temperature, after the initial correction value S shown in FIG. 6C is applied to the output level Sx obtained by detecting the magnetism of the calibration magnetic field by each magnetic sensor 30, a flat waveform is obtained, like the one shown in FIG. 6A obtained when detecting magnetism of the reference medium. However, if an adverse effect of the usage environment such as the temperature, the magnetic field, and the like, causes an error in the output level, the magnetic detection apparatus 10 extracts this error and acquires the measuring-error correction value W as shown in FIG. 7B.

Note that, in the magnetic detection apparatus 10, by comparing the output level Sx of each of the magnetic sensors 30 obtained after generating the calibration magnetic field in the measuring-error calibration and the output level Sw of each of the magnetic sensors 30 that has been stored in the memory 70 when having performed the manufacturing-error calibration, it is possible to detect whether there is a leakage of the electric current and the like. If there is an output level for which a difference between the output level Sx obtained by the magnetic sensor 30 of each of the channels and the corresponding output level Sw stored in the memory 70 exceeds a previously set predetermined threshold value, the control unit 60 outputs to the banknote handling apparatus information indicating the occurrence of an abnormal value and information indicating a channel of the magnetic sensor 30 in which the abnormal value has occurred. The banknote handling apparatus that received this information displays relevant information on an operation/display unit, and a user can be alarmed of the abnormality in the output level of the magnetic sensor 30.

In this manner, once the measuring-error correction value W shown in FIG. 7B is obtained by using the calibration magnetic field generated by using the sensor cover 20 before starting the banknote handling in the banknote handling apparatus, the banknote handling is started, and the magnetic detection apparatus 10 detects the magnetism of each banknote that is transported on the transport path 110.

Figure 8A:
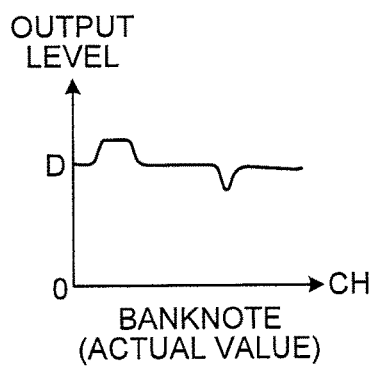
FIGS. 8A and 8B are views for explaining a magnetic detection processing of a banknote.
Figure 8B:
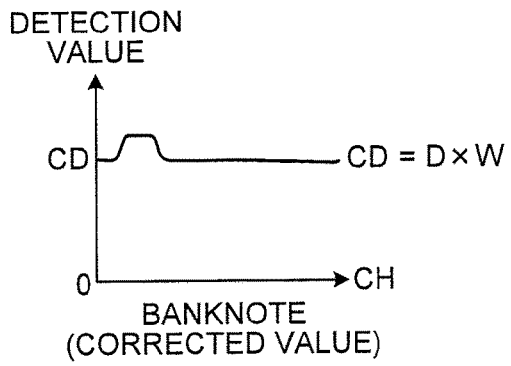

FIG. 8 is a view for explaining the magnetic detection processing of the banknote. When an actual value D obtained by detecting the magnetism of the banknote by the magnetic sensor 30 of each of the channels has a waveform shown in FIG. 8A, the control unit 60 corrects the obtained actual value D by using the measuring-error correction value W acquired before the measurement of values. Specifically, the actual value D is multiplied by the measuring-error correction value W to correct the error due to the usage environment. When a magnetic detection value CD shown in FIG. 8B is obtained as a correction result, the control unit 60 outputs this value as a magnetic detection value of the banknote. The banknote handling apparatus that received this value performs authenticity recognition and the like of the banknote by using the magnetic detection value CD of the banknote.

In this manner, when the magnetic detection apparatus 10 performs the magnetic detection of the banknote, the measuring-error correction value W is acquired, before starting the banknote handling, by using the calibration magnetic field generated by using the sensor cover 20. By correcting the actual value D based on the measuring-error correction value W, the adverse effect due to the usage environment of the temperature, the magnetic field, and the like can be prevented, and the magnetic detection result of the banknote can be obtained with a high accuracy.

Note that, if it is possible to generate a magnetic field having substantially the same direction and the substantially the same magnetic field intensity near each of the magnetic sensors 30 arranged in a linear manner, the structure of the excitation member that generates the calibration magnetic field is not limited to that of the sensor cover 20 shown in FIGS. 2 to 4.

Figure 9A:
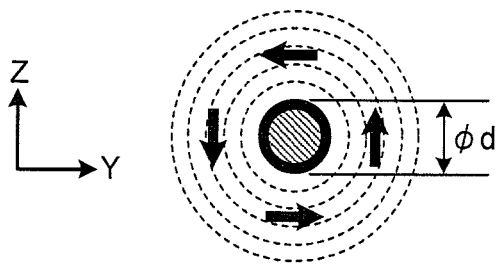
FIGS. 9A, 9B and 9C are views indicating examples of a cross-section of an excitation member and the calibration magnetic field generated around the excitation member.
Figure 9B:
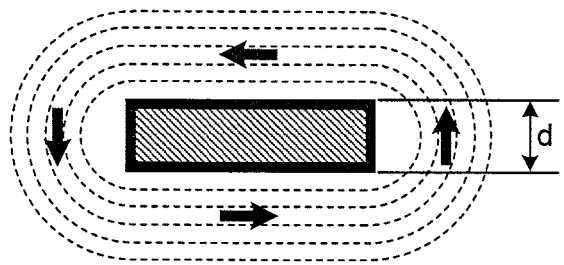
Figure 9C:
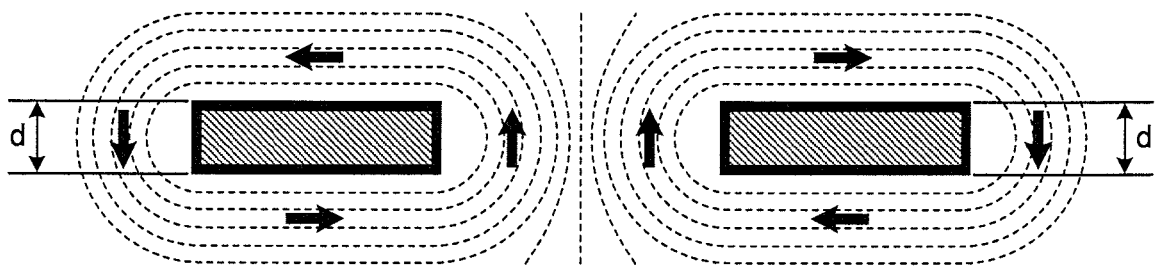

FIGS. 9A to 9C are views indicating examples of a cross-section of the excitation member and the calibration magnetic field generated around the excitation member. FIGS. 9A to 9C show a cross-section of the excitation member when seen from a side (the positive X-axis direction side) thereof and the calibration magnetic field generated around the excitation member by passing the electric current in the excitation member in the X-axis direction. A dotted line in FIGS. 9A to 9C represents the calibration magnetic field, and an arrow represents a direction of the calibration magnetic field.

FIG. 9A is an example in which a conducting wire, is used as the excitation member. The conducting wire is long in the X-axis direction and has a diameter d. FIG. 9B is an example in which a rectangular plate member is used as the excitation member. The rectangular plate member is long in the X-axis direction and has a plate thickness d. FIG. 9C is an example in which two rectangular plate members are used as the excitation member. The two rectangular plate members are long in the X-axis direction and each has a plate thickness d. When an electric current is passed in the excitation member in the X-axis direction to generate the calibration magnetic field, the direction of the magnetic field on the right side of the excitation member is opposite to the direction of the magnetic field on the left side of the excitation member as shown in FIGS. 9A to 9C.

When the cross-section of the excitation member is circular and the like as shown in FIG. 9A, the length in the left-right direction (Y-axis direction) of the excitation member is short. When the length in the left-right direction of the excitation member is short, a distance between the opposing magnetic fields generated on both outer sides of the left and right sides of the excitation member is short. Therefore, even if the positional relationship between the excitation member and the magnetic sensor arranged below the excitation member changes slightly due to shifting of the arrangement position of the magnetic sensor, the direction and/or the magnetic field intensity of the calibration magnetic field acting on the magnetic sensor greatly fluctuate.

In contrast, when the excitation member has a long cross-section in the Y-axis direction as shown in FIG. 9B, the distance between the opposing magnetic fields of the excitation member is long. That is, the distance from the magnetic field on the right side of the excitation member to the magnetic field on the left side of the excitation member is long. Therefore, a fluctuation in the direction and/or the magnetic field intensity of the calibration magnetic field, which occurs when the positional relationship between the excitation member and the magnetic sensor arranged below the excitation member changes, can be inhibited. Similarly, when two excitation members each having a rectangular thin plate shape are used, by passing the electric currents in the respectively opposite directions in the right excitation member and the left excitation member as shown in FIG. 9C, the distance between the opposing magnetic fields on either sides of both the excitation members can be made longer.

Therefore, in the magnetic detection apparatus 10, it is preferable to use the excitation members shown in FIGS. 9B and 9C having the plate shape and the long cross-section in the Y-axis direction. Other examples of the excitation member that differ in the structure from the excitation member shown in FIG. 2 are explained below.

FIGS. 10A to 10G are views indicating the different examples of the excitation member that generates the calibration magnetic field. Similar to FIG. 2, a schematic cross section indicating an internal structure of the magnetic detection apparatus 10 when seen from a side (positive X-axis direction side) thereof is shown in each of FIGS. 10A to 10G. A direction of the calibration magnetic field generated by each of the excitation members near the magnetic sensor 30 is shown with an arrow.

FIG. 10A shows a sensor cover 21 as an example of the excitation member that includes only the flat part of the sensor cover 20 shown in FIG. 2 without including the inclined parts on both outer sides thereof. The sensor cover 21 is supported by the case 11 such that it blocks the opening 12 of the case 11. The sensor cover 21 has a rectangular thin plate shape that is long in the X-axis direction, and the length of the short side parallel to the Y-axis is such that the sensor cover 21 covers the entire two magnetic sensing elements 31 and 32. The sensor cover 21 generates, in the same manner as shown in FIG. 2, near the magnetic sensors 30 that are arranged below the lower surface thereof, the calibration magnetic field. The direction of the calibration magnetic field is in the Y-axis direction.

FIG. 10B shows a sensor cover 22 as an example of the excitation member arranged on the upper surface of the case 11 in the same manner as FIG. 10A. The sensor cover 22 is supported by the case 11 such that it blocks the opening 12 of the case 11. The sensor cover 22 is a rectangular plate-shaped member that is long in the X-axis direction. The sensor cover 22 is arranged such that a right surface (the surface that is parallel to the XZ plane and located on the positive Y-axis direction side) thereof is located on the left side than a right end of the left magnetic sensing element 31 of the magnetic sensor 30. The sensor cover 22 generates, near the magnetic sensors 30 that are present near the right surface side thereof, the calibration magnetic field. The direction of the calibration magnetic field is in the Z-axis direction.

FIG. 10C shows an example in which an excitation member 23 is provided separately from a sensor cover 80. The excitation member 23 is a rectangular plate-shaped member that is long in the X-axis direction. The excitation member 23 is arranged such that a right surface thereof is located on the left side than the right end of the left magnetic sensing element 31 of the magnetic sensor 30. The excitation member 23 is supported by a sensor support member 34 shown with an oblique-line shading in FIG. 10C. The sensor support member 34 has a structure that allows positioning and supporting of each the magnetic sensors 30 arranged in an inclined manner and the excitation member 23 arranged horizontally. The excitation member 23 generates, near the magnetic sensors 30 that are present near the right surface side thereof, the calibration magnetic field. The direction of the calibration magnetic field is in the Z-axis direction. Note that, the sensor cover 80 shown in each of FIGS. 10C to 10F is supported by the case 11 such that it blocks the opening 12 of the case 11.

FIG. 10D shows an example in which an excitation member 24 is provided separately from the sensor cover 80. The excitation member 24 is a rectangular plate-shaped member that is long in the X-axis direction. The excitation member 24 is arranged in an inclined manner with the same angle of inclination as that of the magnetic sensors 30 such that a right surface thereof is located on the left side than the right end of the left magnetic sensing element 31 of the magnetic sensor 30. The excitation member 24 is supported by a sensor support member 35 shown with an oblique-line shading in FIG. 10D. The sensor support member 35 has a structure that allows positioning and supporting of the magnetic sensors 30 and the excitation member 24 that are arranged in an inclined manner. The excitation member 24 generates, near the magnetic sensors 30 that are present near the right surface side thereof, the calibration magnetic field. The direction of the calibration magnetic field is orthogonal to a surface in which the two magnetic sensing elements 31 and 32 are arranged.

FIG. 10E shows an example in which an excitation member 25 is provided in addition to the sensor cover 80. The excitation member 25 has a rectangular thin plate shape that is long in the X-axis direction. The excitation member 25 is fixed to a lower surface of the sensor cover 80 via an insulating member 81. The excitation member 25 is arranged such that a right surface thereof is located on the left side than the right end of the left magnetic sensing element 31 of the magnetic sensor 30. The excitation member 25 generates, near the magnetic sensors 30 that are present near the right surface side thereof, the calibration magnetic field. The direction of the calibration magnetic field is in the Z-axis direction.

FIG. 10F shows an example in which two excitation members 26 (26a and 26b) are provided in addition to the sensor cover 80. Each of the two excitation members 26a and 26b has a rectangular thin plate shape that is long in the X-axis direction. The excitation members 26a and 26b are respectively fixed to a lower surface of the sensor cover 80 via insulating members 82 (82a and 82b). With respect to a position in the Y-axis direction, the left excitation member 26a is arranged such that a right end thereof is located on the left side than the right end of the left magnetic sensing element 31, and the right excitation member 26b is arranged such that a left end thereof is located on the right side than the left end of the right magnetic sensing element 32. The excitation members 26a and 26b are arranged with a gap between them in the Y-axis direction. The two excitation members 26a and 26b generate, near the magnetic sensors 30 and between the two excitation members 26a and 26b, the calibration magnetic field. The direction of the calibration magnetic field is in the Z-axis direction. Note that, the excitation members 25 and 26 shown in FIGS. 10E and 10F can be constituted, for example, with a flexible printed circuit substrate (FPC) formed on the sensor cover 80.

FIG. 10G shows an example in which two sensor covers 27 (27a and 27b) arranged on the upper surface of the case 11 are used as the excitation member. Each of the two sensor covers 27a and 27b has a rectangular thin plate shape that is long in the X-axis direction. Moreover, each of the two sensor covers 27a and 27b are supported by the case 11 such that they block the respective opening 12 (12a and 12b) of the case 11. In the same manner as FIG. 10F, with respect to a position of in the Y-axis direction, the left sensor cover 27a is arranged such that a right end thereof is located on the left side than the right end of the left magnetic sensing element 31, and the right sensor cover 27b is arranged such that a left end thereof is located on the right side than the left end of the right magnetic sensing element 32. The sensor covers 27a and 27b are arranged with a gap between them in the Y-axis direction. The two sensor covers 27a and 27b generate, near the magnetic sensors 30 and between the two sensor covers 27a and 27b, the calibration magnetic field. The direction of the calibration magnetic field is in the Z-axis direction.

An example has been explained above in which each of the magnetic sensors 30 includes the two magnetic sensing elements 31 and 32; however, the number of the magnetic sensing elements is not limited to two. The magnetic sensor can include one magnetic sensing element or three or more magnetic sensing elements.

As has been explained above, in the magnetic detection apparatus 10 according to present embodiment, the calibration magnetic field can be generated by using the excitation members 20 to 27 and the magnetic sensors 30 can be calibrated. Because a rectangular plate-shaped member that is long in the arrangement direction of the magnetic sensors 30 is used as the excitation members 20 to 27, the direction and the magnetic field intensity of the calibration magnetic field will be substantially the same near the magnetic sensors 30 that are arranged in a linear manner, so that each of the magnetic sensors can be calibrated with a high accuracy.

The excitation members 20 to 22, and 27 also serve as the cover of the case 11 of the magnetic detection apparatus 10. Accordingly, unlike in the case in which the excitation member is to be arranged between the cover and the magnetic sensors 30, it is not necessary to secure a space for the excitation member between the cover and the magnetic sensors 30 and therefore, the magnetic detection apparatus 10 can be downsized. At least a part of a surface of the excitation members 20 to 22, and 27 serving as the cover is exposed to the outside from the transport path 110 on which the paper sheet is transported; however, wear resistance of the excitation members 20 to 22, and 27 is realized by making the excitation members 20 to 22, and 27 with nonmagnetic conducting metal or conductive ceramics. The electric current is passed in the excitation members 20 to 22, and 27 serving as the cover at the time of calibration to generate the calibration magnetic field; however, ordinarily, the excitation member is connected to ground allowing elimination of any adverse effect of external noise.

The magnetic detection apparatus 10 performs the calibration processing by using the excitation members 20 to 27 at the time of manufacturing to acquire the initial correction value for correcting an adverse effect of manufacturing variation at the time of manufacturing, and stores the acquired initial correction value in the memory 70. When performing the magnetic detection of the paper sheet by using the magnetic detection apparatus 10 after the apparatus has been shipped, the measuring-error calibration is performed by using the excitation members 20 to 27 before performing the magnetic detection for paper sheets. At this time, the correction is performed by using the initial correction value. Accordingly, the measuring-error correction value for correcting any adverse effect of the usage environment of the magnetic detection apparatus 10 can be acquired with a high accuracy. The adverse effect of the manufacturing variation at the time of manufacturing, such as an assembling error and/or parts precision at the time of manufacturing, is corrected by using the initial correction value, and the adverse effect of the usage environment, such as the temperature and the magnetic field, is corrected by using the measuring-error correction value when actually detecting the magnetism of the paper sheet. Accordingly, in the magnetic detection apparatus 10, the magnetism of the paper sheet can be detected with a high accuracy.

INDUSTRIAL APPLICABILITY

As explained above, the magnetic detection apparatus according to present invention is useful because of the fact that it is a smaller magnetic detection apparatus capable of performing calibration of a plurality of magnetic sensors with a high accuracy.

EXPLANATION OF REFERENCE NUMERALS

10 Magnetism detection apparatus
11 Case
20 to 22, 27 Sensor cover (excitation member)
23 to 26 Excitation member
30 Magnetic sensor
31, 32 Magnetic sensing element
33 to 35 Sensor support member
41, 42 Bias magnet
50 Calibration circuit
51 Voltage switch
52 Constant current control circuit
60 Control unit
70 Memory
80 Sensor cover
81, 82 Insulating member
110 Transport path

The invention claimed is:

1. A magnetic detection apparatus that detects magnetism of a paper sheet being transported, comprising:
   a plurality of magnetic sensors arranged in a linear manner in a direction orthogonal to a transport direction of the paper sheet;
   an excitation member having a plate-shape that extends in an arrangement direction of the plurality of magnetic sensors; and
   a control unit that generates a calibration magnetic field by passing an electric current in the arrangement direction through the excitation member, and obtains a correction value for correcting variation in sensitivity of the plurality of magnetic sensors based on detection results of the calibration magnetic field detected by the plurality of magnetic sensors,
   wherein at least a part of one surface of the excitation member is exposed on an outside of the magnetic detection apparatus, and the exposed part is used as a cover and a magnetic detection surface of the magnetic detection apparatus.

2. The magnetic detection apparatus as claimed in claim 1, wherein the excitation member is connected to ground, and the electric current is passed through the excitation member only when the calibration magnetic field is to be generated.

3. The magnetic detection apparatus as claimed in claim 1, wherein the calibration magnetic field is generated below a lower surface of the excitation member such that a direction of the magnetic field is substantially parallel to the lower surface of the excitation member and orthogonal to the arrangement direction of the plurality of magnetic sensors.

4. The magnetic detection apparatus as claimed in claim 1, wherein the calibration magnetic field is generated on a side surface side of the excitation member such that a direction of the magnetic field is substantially parallel to the side surface of the excitation member and orthogonal to the arrangement direction of the plurality of magnetic sensors.

5. The magnetic detection apparatus as claimed in claim 1, wherein
   the control unit is configured to, at the time of manufacturing, generate the calibration magnetic field by using the excitation member, obtain an initial correction value for correcting variation in the sensitivity of the plurality of magnetic sensors, and store an obtained initial correction value,
   the control unit is configured to, when starting magnetic detection of the paper sheet, generate the calibration magnetic field by using the excitation member, correct by using the initial correction value a detection value of the calibration magnetic field detected by the plurality of magnetic sensors, and obtain, based on a corrected detection value, a measuring-error correction value for correcting variation in the sensitivity of the plurality of magnetic sensors, and
   the control unit is configured to, during the magnetic detection of the paper sheet, correct a detection value of the magnetism of the paper sheet by using the measuring-error correction value.

6. The magnetic detection apparatus as claimed in claim 5, wherein, after generation of the calibration magnetic field by using the excitation member is repeated for a predetermined number of times, the calibration magnetic field is generated again by using the excitation member to obtain a correction value.

7. The magnetic detection apparatus as claimed in claim 1, wherein each of the plurality of magnetic sensors includes two magnetic sensing elements.

8. The magnetic detection apparatus as claimed in claim 7, wherein the magnetic sensor is supported in an inclined manner inside the magnetic detection apparatus such that a distance from a transport surface on which the paper sheet is transported to one magnetic sensing element is different from a distance from the transport surface to the other magnetic sensing element.

9. A method for obtaining a correction value for correcting variation in sensitivity of a plurality of magnetic sensors included in a magnetic detection apparatus, the method comprising:
   generating a calibration magnetic field by passing an electric current through an excitation member in an arrangement direction of the plurality of magnetic sensors arranged in a linear manner, the excitation member having a plate-shape that extends in the arrangement direction; and
   obtaining the correction value for correcting variation in sensitivity of the plurality of magnetic sensors based on detection results of the calibration magnetic field detected by the plurality of magnetic sensors,
   wherein at least a part of one surface of the excitation member is exposed on an outside of the magnetic detection apparatus, and the exposed part is used as a cover and a magnetic detection surface of the magnetic detection apparatus.

10. The method for obtaining the correction value as claimed in claim 9, wherein the excitation member is connected to ground, and the electric current is passed through the excitation member only when the calibration magnetic field is to be generated.

11. The method for obtaining the correction value as claimed in claim 9, wherein
   at the time of manufacturing of the magnetic detection apparatus, the generating and the obtaining are performed to obtain the correction value that is used as an initial correction value,
   before the magnetic detection apparatus starts detection of magnetism of a paper sheet, the generating is performed, a detection value of the calibration magnetic field detected by the plurality of magnetic sensors is corrected by using the initial correction value, the obtaining is performed based on a corrected detection value to obtain the correction value that is used as a measuring-error correction value, and
   while the detection of the magnetism of the paper sheet, the magnetic detection apparatus corrects a detection value of the magnetism of the paper sheet by using the measuring-error correction value.

12. The method for obtaining the correction value as claimed in claim 11, wherein after repeating the generating for a predetermined number of times, the generating and the obtaining are performed to obtain a correction value.

* * * * *